(12) United States Patent
Takeuchi et al.

(10) Patent No.: US 10,797,183 B2
(45) Date of Patent: Oct. 6, 2020

(54) CAPACITOR

(71) Applicant: Murata Manufacturing Co., Ltd., Nagaokakyo-shi, Kyoto-fu (JP)

(72) Inventors: Masaki Takeuchi, Nagaokakyo (JP); Shigeki Nishiyama, Nagaokakyo (JP); Hiroshi Nakagawa, Nagaokakyo (JP); Satoru Goto, Nagaokakyo (JP); Yoshinari Nakamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 14 days.

(21) Appl. No.: 16/192,865

(22) Filed: Nov. 16, 2018

(65) Prior Publication Data
US 2019/0088800 A1    Mar. 21, 2019

Related U.S. Application Data

(63) Continuation of application No. PCT/JP2017/021542, filed on Jun. 9, 2017.

(30) Foreign Application Priority Data

Jun. 22, 2016 (JP) .................................. 2016-123511

(51) Int. Cl.
  *H01L 29/94* (2006.01)
  *H01L 21/822* (2006.01)
  (Continued)

(52) U.S. Cl.
  CPC .......... *H01L 29/945* (2013.01); *H01L 21/822* (2013.01); *H01L 23/60* (2013.01);
  (Continued)

(58) Field of Classification Search
  CPC ... H01L 29/945; H01L 27/0805; H01L 28/90; H01L 21/822; H01L 29/0607; H01L 23/60
  See application file for complete search history.

(56) References Cited

U.S. PATENT DOCUMENTS

2004/0099898 A1 * 5/2004 Grivna .............. H01L 29/66181
                                                              257/309
2006/0163636 A1    7/2006 Cheng et al.
                    (Continued)

FOREIGN PATENT DOCUMENTS

DE    19940825 A1    4/2001
EP    0993030 A2     4/2000
                 (Continued)

OTHER PUBLICATIONS

International Search Report issued for PCT/JP2017/021542 dated Aug. 29, 2017.
(Continued)

*Primary Examiner* — Mohammed R Alam
(74) *Attorney, Agent, or Firm* — Arent Fox LLP

(57) ABSTRACT

A capacitor that includes a substrate; a capacitor formation region in which one or more trenches are formed; a dummy region located between the capacitor formation region and an end of the substrate; a first electrode formed inside the one or more trenches to cover the capacitor formation region, and a dielectric film; a second electrode that covers the capacitor formation region and has a different potential from the first electrode; and an extended portion that formed in the dummy region. Moreover, the extended portion forms a recess or a protrusion on the substrate in a path from the second electrode to the end portion of the substrate.

18 Claims, 9 Drawing Sheets

(51) Int. Cl.
*H01L 49/02* (2006.01)
*H01L 27/08* (2006.01)
*H01L 23/60* (2006.01)
*H01L 29/06* (2006.01)

(52) U.S. Cl.
CPC .......... *H01L 27/0805* (2013.01); *H01L 28/90* (2013.01); *H01L 29/0607* (2013.01)

(56) References Cited

U.S. PATENT DOCUMENTS

| | | |
|---|---|---|
| 2007/0296010 A1 | 12/2007 | Su et al. |
| 2010/0181645 A1* | 7/2010 | Marenco ............. H01L 27/0694 257/532 |
| 2016/0181415 A1 | 6/2016 | Masuda |

FOREIGN PATENT DOCUMENTS

| | | |
|---|---|---|
| JP | 2003100938 A | 4/2003 |
| JP | 2005353657 A | 12/2005 |
| JP | 2008218121 A | 9/2008 |
| JP | 2014022600 A | 2/2014 |
| JP | 2014241434 A | 12/2014 |
| JP | 2015032665 A | 2/2015 |

OTHER PUBLICATIONS

Written Opinion of the International Searching Authority issued for PCT/JP2017/021542 dated Aug. 29, 2017.

* cited by examiner

CAPACITOR

CROSS REFERENCE TO RELATED APPLICATIONS

The present application is a continuation of PCT/JP2017/021542 filed Jun. 9, 2017, which claims priority to Japanese Patent Application No. 2016-123511, filed Jun. 22, 2016, the entire contents of each of which are incorporated herein by reference.

TECHNICAL FIELD

The present disclosure relates to a capacitor.

BACKGROUND

In recent years, semiconductor devices that use trench capacitors have become widely popular.

Patent Document 1 (identified below) discloses a power semiconductor that includes such a trench capacitor. The power semiconductor described in Patent Document 1 includes a flyback diode that performs the same operation as a unipolar operation, and a semiconductor circuit which includes a capacitor and a resistance connected in parallel to the flyback diode. This semiconductor circuit functions as at least part of the resistance. Furthermore, the semiconductor circuit includes a semiconductor substrate whose resistance value is at least larger than a resistance value included in the flyback diode, and a dielectric region which uses the semiconductor substrate as one electrode of the capacitor, and has a larger surface area than an area of a predetermined area in the predetermined area on one principal surface of the semiconductor substrate.

Patent Document 1: Japanese Patent Application Laid-Open No. 2014-241434.

An upper electrode of the trench capacitor described in Patent Document 1 is formed in the same area as an element area in a plan view (when seen from a top view of the trench). Hence, the upper electrode and a lower electrode (n-Si corresponds to the lower electrode in Patent Document 1) are apart by a distance corresponding to the film thickness of $SiO_2$ which is a dielectric body on a side surface portion of an element. In this regard, while breakdown electric field strength of $SiO_2$ is approximately 10 MV/cm, breakdown electric field strength of air is approximately 30 kV/cm and low. The film thickness of a capacitor dielectric body such as $SiO_2$ is approximately several μm at maximum. Therefore, when, for example, a high voltage is applied between electrodes of the trench capacitor in the power semiconductor in Patent Document 1, the power semiconductor may experience a so-called creeping discharge that occurs between the upper and lower electrodes and the capacitor breaks down before $SiO_2$ breaks down, and in addition the power semiconductor also may break down.

SUMMARY OF THE INVENTION

The present disclosure has been made in light of such a situation described above. Thus, it is an object of the present disclosure to prevent device destruction due to creeping discharge in a capacitor used for a power semiconductor.

A capacitor according to one exemplary aspect includes a substrate; a capacitor formation region in which one or more trenches are provided on the substrate; a dummy region which is located between the capacitor formation region and an end of the substrate; a first electrode which is provided inside the one or more trenches to cover at least the capacitor formation region, and a dielectric film; a second electrode which covers the capacitor formation region and has a different potential from the first electrode; and an extended portion which is formed in the dummy region, and forms a recess or a protrusion on the substrate in a path from the second electrode to the end portion of the substrate.

According to the present disclosure, it is possible to prevent device destruction due to creeping discharge in a power semiconductor which uses a trench capacitor.

DETAILED DESCRIPTION

First Exemplary Embodiment

The first exemplary embodiment of the present disclosure will be described below with reference to accompanying FIGS. 1 to 4.

Planar Structure of Capacitor)

Figure 1:
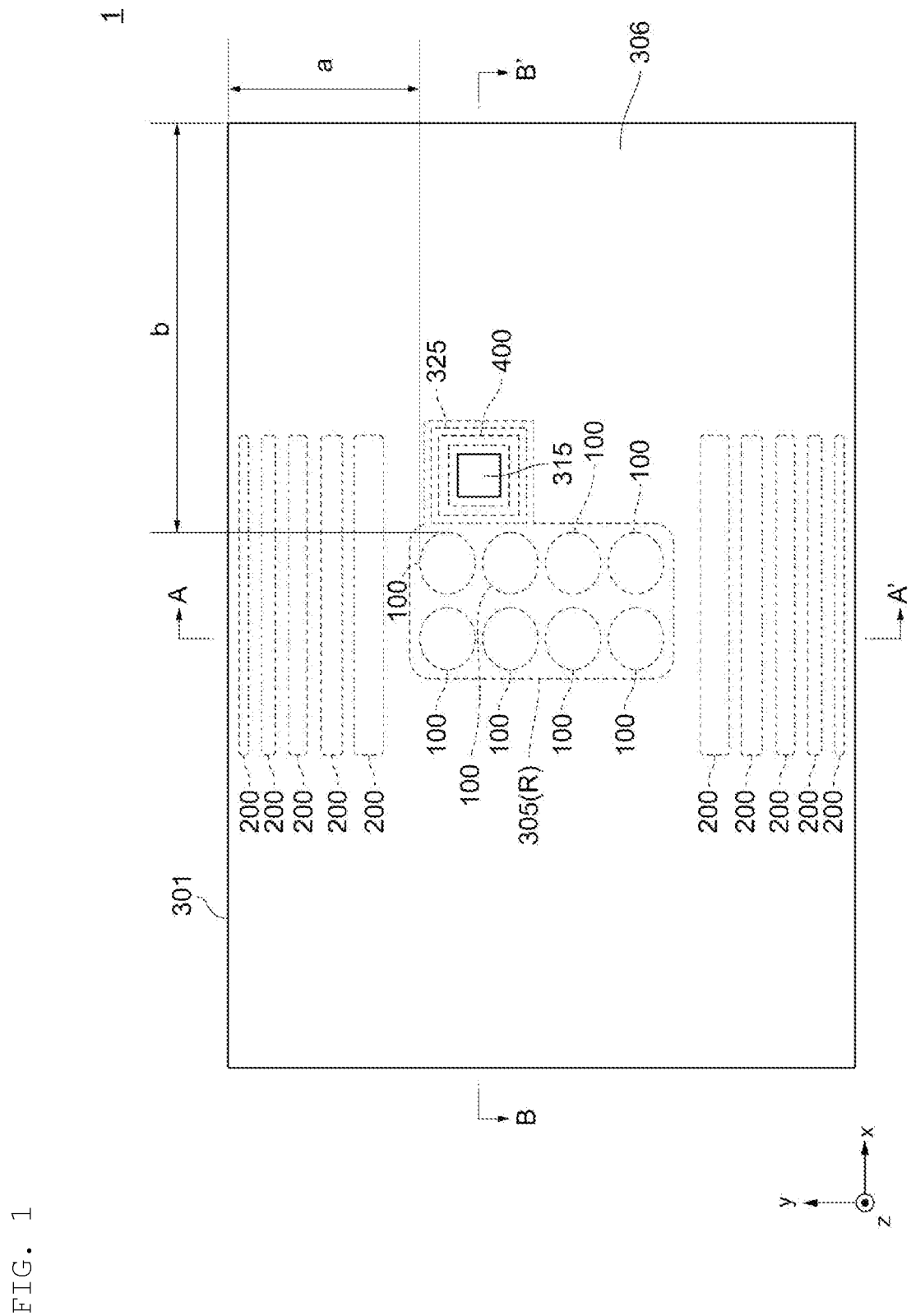
FIG. 1 is a plan view schematically illustrating a structure of a capacitor 1 according to a first exemplary embodiment.

FIG. 1 is a plan view of a capacitor 1 according to the present embodiment. A planar structure of the capacitor 1 will be described with reference to FIG. 1. In addition, FIG. 1 illustrates extracted necessary components for explaining at least part of features of the planar structure of the capacitor 1, yet does not prevent components illustrated in other drawings from being specified as should be appreciated.

As illustrated in FIG. 1, the capacitor 1 includes in this planar structure, a substrate 301, a plurality of trenches 100, a plurality of dummy trenches 200 (an example of extended portions) and a ring trench 400, which are formed on the substrate 301, an upper electrode 305 (which can be an example of a first electrode or a second electrode) that is formed on the substrate 301, a terminal 325 that is formed on the upper electrode 305, and an insulation film 306 that is formed to cover the upper electrode 305. As shown, the capacitor 1 according to the present embodiment includes the dummy trenches 200 as the example of the extended portions to extend a path length of an end portion of the upper electrode 305 and an end portion of a lower electrode 302 (see FIG. 2) and prevent creeping discharge. The details are as follows.

In particular, the substrate 301 has a rectangular shape including long sides (an example of first sides) and short sides (an example of second sides) according to the present embodiment. In addition to the components illustrated in FIG. 1, components such as a transistor, an FET, a resistance and an inductor may be provided on the substrate 301.

The trenches 100 are grooves or holes formed by forming openings in the substrate 301 (i.e., that extend downward into the substrate). In the present exemplary embodiment, the trenches 100 are formed to align in four rows along an x axis and in two columns along a y axis at substantially equal intervals near a center of the substrate 301. Furthermore, in the exemplary aspect, the cavities of the trenches 100 have substantially circular shapes which are approximately 5 μm in diameter, for example. It should be appreciated that the shapes of the cavities of the trenches 100 are not limited to the substantially circular shapes. For example, the shapes of the cavities of the trenches 100 may be polygonal shapes such as square shapes and triangular shapes. Furthermore, corners of the polygonal shape may be chamfered. Furthermore, the number of the trenches 100 only needs to be one or more, and the trenches 100 are not limited to the number and an arrangement illustrated in FIG. 1.

The upper electrode 305 is formed to cover a region in which the trenches 100 are formed, and an adjacent region of this region (a region corresponding to a region in which the terminal 325 described below is formed in FIG. 1) (the region in which the upper electrode 305 is formed will be referred to as a capacitor formation region R below). In addition, as illustrated in FIG. 1, in the present embodiment, the upper electrode 305 has a shape along outlines of the trenches 100 and the terminal 325. However, the shape of the upper electrode 305 is not limited to this. For example, the upper electrode 305 may have a rectangular shape which covers the region in which the trenches 100 are formed and the region in which the terminal 325 is formed.

It is further noted that the capacitor formation region R is not limited to a region indicating the region in which the upper electrode 305 is formed, and may indicate, for example, only a region (a substantially center region of the substrate 301) in which a plurality of trenches 100 is formed.

According to the exemplary aspect, the terminal 325 is a terminal that electrically connects the upper electrode 305 to an external component device that is outside of the capacitor 1. As shown, the terminal 325 has a substantially rectangular shape, and is formed at a position adjacent to the column in which a plurality of trenches 100 is aligned. In FIG. 1, the terminal 325 is formed adjacent to the two trenches 100 included in the column including the four trenches 100 aligned along a y axis direction. Although details will be described with reference to FIG. 4, the terminal 325 is formed on the upper electrode 305, and is partially exposed through a hole 315 formed on the insulation film 306.

In addition, in the present embodiment, the terminal 325 is formed in the region adjacent to the region in which the trenches 100 are formed, yet is not limited to this. For example, the terminal 325 may be formed in the region between the four adjacent trenches 100 (between the rows and/or the columns of the trenches 100) among a plurality of trenches 100, and may be formed above the trenches 100 to cover the trenches 100 with the upper electrode 305 interposed therebetween. In this regard, as described in the present embodiment, the terminal 325 is formed such that it does not cover the trenches 100, so that it is possible to prevent the capacitor formed on the trenches 100 from deteriorating or being broken in a process of testing or mounting the capacitor 1.

According to the exemplary embodiment, the ring trench 400 is a trench of a frame shape formed in the region in which the terminal 325 is formed on the substrate 301. The width of the cavity of the ring trench 400 is preferably, for example, approximately 10 μm or less. In addition, the ring trench 400 is not limited to the frame shape as long as the ring trench 400 has the ring shape, and may have an annular shape.

The hole 315 is an opening formed by removing part of the insulation film 306 on the terminal 325, and has a shape along the ring trench 400.

The dummy trenches 200 are grooves or holes formed by forming openings in the substrate 301. In the present embodiment, a plurality of dummy trenches 200 is formed in a region (i.e., a dummy region) between the capacitor formation region R and the end portion of the substrate 301.

More specifically, the five dummy trenches 200 are provided at substantially equal intervals to align on a line in a direction (the y axis direction in FIG. 1) traveling from the capacitor formation region R to the end portion of the substrate 301. Furthermore, in the present embodiment, the dummy trenches 200 are formed in a region at a shorter one of distances of a distance "a" from the end portion of the upper electrode 305 to the long side of the substrate 301 and a distance "b" to the short side. In the example in FIG. 1, the distance a is shorter than the distance b. Hence, the dummy trenches 200 in the capacitor 1 according to the present embodiment are provided between the long side of the substrate 301 and the capacitor formation region R to align with the upper electrode 305 in a direction (which is the y axis direction in FIG. 1 and will be also referred to as a "first direction" below) traveling to the long side of the substrate 301. In addition, the capacitor 1 can also employ a configuration where the dummy trenches 200 are formed in both of the region between the capacitor formation region R and the long side and the region between the capacitor formation region R and the short side or a configuration where the dummy trenches 200 are formed only in the region between the capacitor formation region R and the short side.

The shapes of the cavities of the dummy trenches 200 are substantially rectangular shapes (an example of cavities having a longitudinal direction). More specifically, the cavities of the dummy trenches 200 are provided such that the longitudinal direction is along a direction (which is an x axis direction in FIG. 1 and will be also referred to as a "second direction" below) substantially vertical or orthogonal to the first direction (the y axis direction in FIG. 1). In addition, it is reiterated that the shapes of the cavities of the dummy trenches 200 are not limited to the substantially rectangular shapes. The shapes of the cavities of the dummy trenches 200 may be, for example, polygonal shapes such as square shapes and triangular shapes. Furthermore, corners of the polygonal shape may be chamfered. Furthermore, the number of the dummy trenches 200 only needs to be one or more, and is not limited to the number illustrated in FIG. 1.

Cross-Sectional Structure of Capacitor

Figure 2:
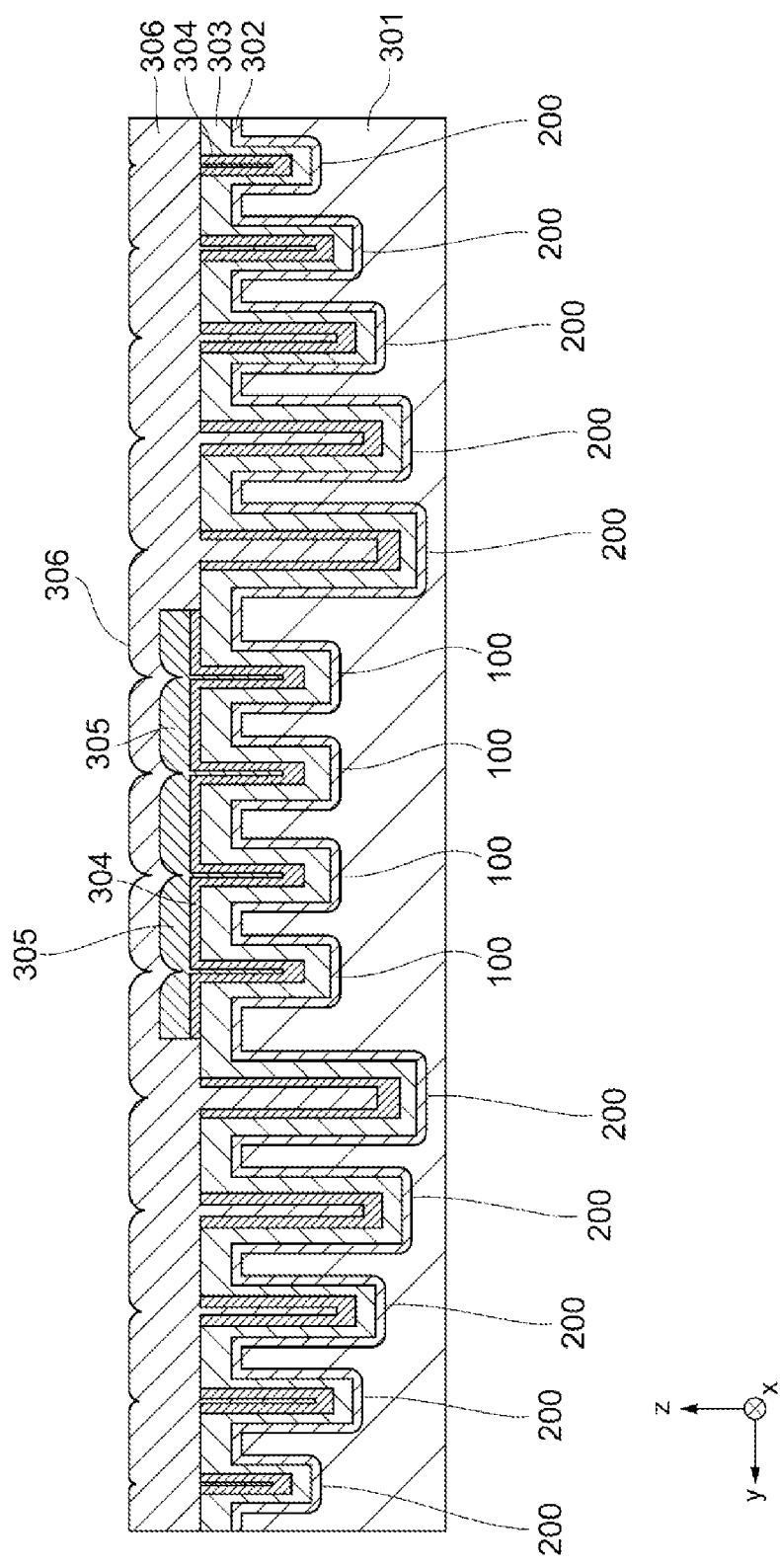
FIG. 2 is an AA' cross-sectional view of FIG. 1.

A cross-sectional structure of the capacitor 1 will be described with reference to FIG. 2. More particularly, FIG. 2 illustrates an AA' cross section of FIG. 1, and is a cross-sectional view schematically illustrating a configuration example of the capacitor 1 according to the first exemplary embodiment. As illustrated in FIG. 2, the capacitor 1 includes the substrate 301, the lower electrode 302, a dielectric film 303, a buffer film 304, the upper electrode 305 and the insulation film 306.

The substrate 301 is formed by, for example, Si (silicon) which is approximately 680 μm in thickness. In addition, when the substrate 301 is formed by an n-type Si (silicon) or a p-type Si, the substrate 301 can also play a function of the lower electrode 302 described below. In this case, P (phosphor), As (arsenic) or Sb (antimony) can be included as an n-type dopant. B (boron) can be included as a p-type dopant.

A plurality of trenches 100 and a plurality of dummy trenches 200 are formed on the substrate 301 as further shown according to the exemplary embodiment.

The plurality of trenches 100 are grooves formed in a thickness direction of the substrate 301. The trenches 100 are formed by, for example, dry etching. The depths of the trenches 100 are preferably, for example, approximately 15 μm or more and 25 μm or less. In addition, the depths of the trenches 100 refer to distances from planes of the trenches 100 which widen along the surface of the substrate 301 to a point which is the farthest from the planes inside the trenches 100.

A plurality of dummy trenches 200 are grooves formed in the thickness direction of the substrate 301 similar to the trenches 100. The dummy trenches 200 are formed by, for example, dry etching. In addition, cross-sectional structures of the dummy trenches 200 will be described in detail below.

The lower electrode 302 (the example of the first electrode or the second electrode) is formed on the surface of the substrate 301 including inner walls of the trenches 100 and inner walls of the dummy trenches 200. The lower electrode 302 is formed by using, for example, Mo (molybdenum), Al (aluminum), Au (gold), W (tungsten), and Pt (platinum). In addition, a material of the lower electrode 302 is not limited to a metal as long as the material is a conductive material, and may be, for example, a conductive resin. Furthermore, the lower electrode 302 only needs to be formed in at least the capacitor formation region R, and may not be formed in other regions (e.g., the inner walls of the dummy trenches 200) on the surface of the substrate 301.

An oxide film (not illustrated) which is approximately 0.3 μm in thickness is preferably formed between the substrate 301 and the lower electrode 302 by oxidation such as a thermal oxidation method. The oxide film is also formed on the inner walls of the trenches 100 and the inner walls of the dummy trenches 200. The oxide film is formed by oxide silicon (e.g., $SiO_2$). The oxide film is formed on the surface of the substrate 301, so that it is possible to improve resistance of the capacitor formed in the trenches 100.

The dielectric film 303 which is approximately 1 in thickness, for example, is formed on the surface of the lower electrode 302 including the inner walls of the trenches 100 and the inner walls of the dummy trenches 200. The dielectric film 303 is formed by silicon nitride (e.g., $Si_3N_4$). In addition, the dielectric film 303 also only needs to be formed to cover at least the capacitor formation region R, and may not be formed in other regions (e.g., the inner walls of the dummy trenches 200) on the surface of the substrate 301.

Furthermore, the upper electrode 305 which is approximately 4 μm in thickness, for example, is formed on a surface of the dielectric film 303 including the inner walls of the trenches 100 in the capacitor formation region R with the buffer film 304 which is approximately 0.5 μm in thickness interposed therebetween. The buffer film 304 is formed by using, for example, a conductive material such as doped polycrystal Si (polycrystal silicon).

The buffer film 304 is stacked on the dielectric film 303, and then is removed from a region other than the surface of the capacitor formation region R by etching. In this regard, in the present embodiment, the buffer film 304 inside the trenches 100 and the dummy trenches 200 is left without being removed. From a viewpoint of making creeping discharge hardly occur, the buffer film 304 is preferably removed completely. Even when a material which forms the upper electrode 305 hardly closely contacts a material which forms the dielectric film 303, it is possible to improve adhesiveness by interposing the buffer film 304 between these materials.

The upper electrode 305 is formed by using, for example, Mo (molybdenum), Al (aluminum), Au (gold), W (tungsten), and Pt (platinum). In addition, a material of the upper electrode 305 is not limited to a metal as long as the material is a conductive material, and may be, for example, a conductive resin. Furthermore, in a case of a configuration where the lower electrode 302 is formed only in the capacitor formation region R, the upper electrode 305 may be formed in a region (e.g., the inner walls of the dummy trenches 200) other than the capacitor formation region R. Furthermore, as illustrated in FIG. 2, a surface of the upper electrode 305 includes dents at positions meeting the cavities, respectively, of the trenches 100. In other words, the dents correspond to the trenches in the vertical z direction as shown.

Thus, the capacitor formation region R includes a multilayer structure of the lower electrode 302, the dielectric film 303 and the upper electrode 305, and therefore functions as the capacitor. In addition, as described above, when silicon whose resistance has been lowered is used for the substrate 301, the substrate 301 can be configured to function also as the lower electrode 302.

Furthermore, the insulation film 306 which is approximately 30 μm in thickness is formed on an outermost surface of the capacitor 1 including the inner walls of the dummy trenches 200 and the trenches 100. The insulation film 306 is formed by using, for example, polyimide. A surface of the insulation film 306 includes dents at positions meeting the cavities of the dummy trenches 200 and the trenches 100. In addition, the insulation film 306 only needs to cover the surface of the capacitor 1, at least the one dummy trench 200 and at least the one trench 100, and be formed from at least the capacitor formation region R to the region (dummy region) in which the dummy trenches 200 are formed, and is not limited to a configuration where the insulation film 306 covers the substantially entire surface of the substrate 301.

Next, a cross-sectional structure of the dummy trench 200 will be described in detail. In the present embodiment, the dummy trenches 200 formed near a boundary with the capacitor formation region R among a plurality of dummy trenches 200 preferably have deeper grooves than the other dummy trenches 200, and the longer lengths along the first direction of the cavity. More preferably, toward the boundary of the capacitor formation region R, the groove of the dummy trench 200 to be formed gradually becomes deeper and the lengths along the first direction of the cavities become gradually longer.

The depths of the dummy trenches 200 are preferably 0.5 times or more and two times or less as the depths of the trenches 100, for example. In addition, the depths of the dummy trenches 200 refer to distances from planes of the cavities of the dummy trenches 200 which widen along the surface of the substrate 301 to a point which is the farthest from the planes inside the dummy trenches 200. Diameters in the longitudinal direction of the cavities (the lengths along the x axis direction in FIG. 1) of the dummy trenches 200 are preferably longer than the width of the upper electrode 305 provided in substantially parallel to the longitudinal direction. More specifically, the lengths along the first direction of the cavities of the dummy trenches 200 are preferably 1 μm or more and 100 μm or less.

The capacitor formation region R in which the upper electrode 305 is formed has a higher thermal expansion coefficient than other regions without the upper electrode 305. Therefore, a stress concentrates near a boundary between the capacitor formation region R and the other regions. The capacitor 1 according to the present embodiment can prevent the concentration of the stress due to the upper electrode 305 by making the grooves of the dummy trenches 200 formed near the boundary of the capacitor formation region R deeper.

Furthermore, by decreasing the lengths along the first direction of the cavities of the dummy trenches 200 formed other than near the boundary of the capacitor formation region R, it is possible to form more dummy trenches 200.

Function of Dummy Trench

Figure 3:
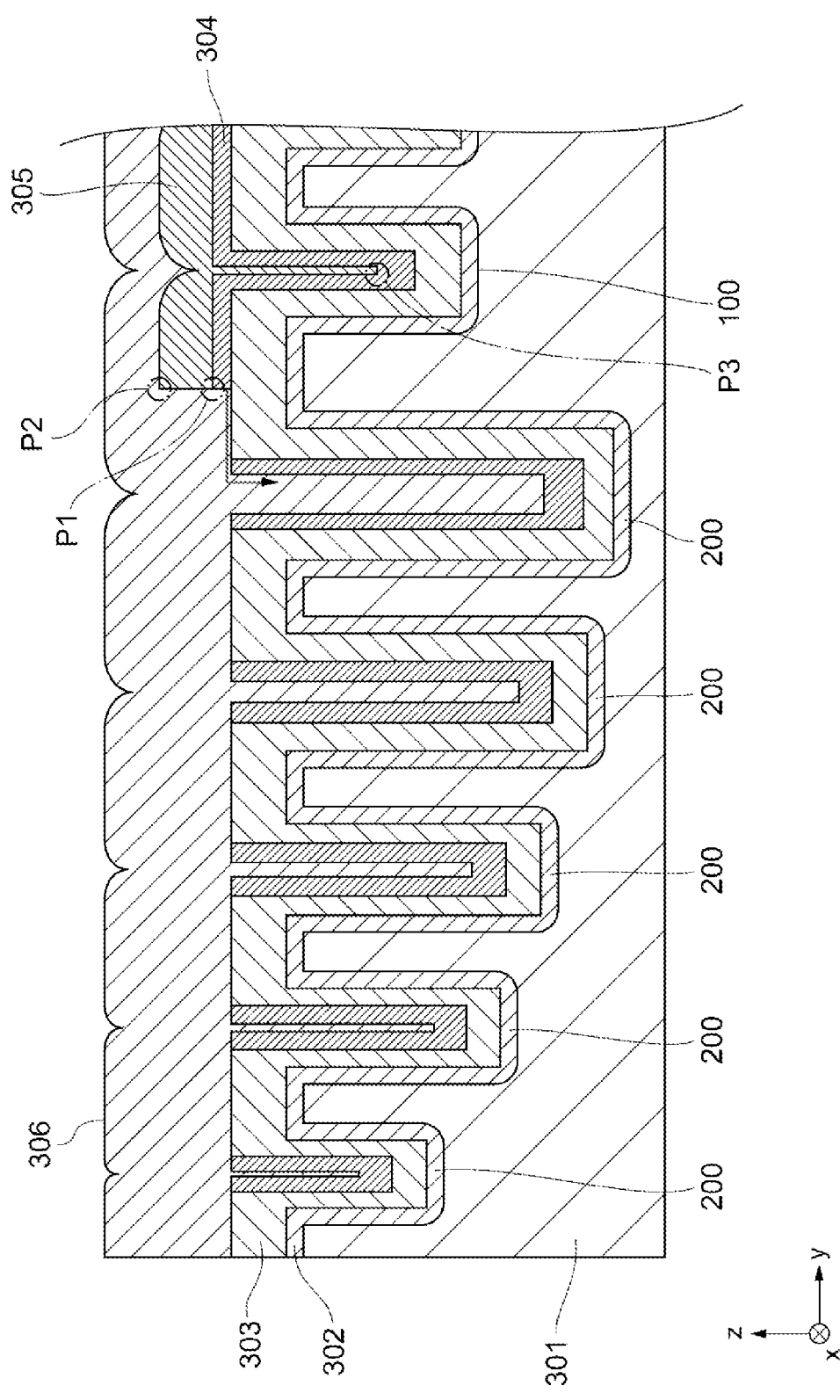
FIG. 3 is an extracted cross-sectional view illustrating that creeping discharge occurs in the capacitor 1 according to the first exemplary embodiment.

Next, a function of the dummy trench 200 of the capacitor 1 according to the present embodiment will be described with reference to FIG. 3. FIG. 3 is a view illustrating an extracted and enlarged part of a cross-sectional view (FIG. 2) of the capacitor 1 according to the present embodiment. When, for example, the capacitor 1 is used for a device such as a power semiconductor device which is driven by a high voltage, a strong electric field is applied also to the capacitor 1. As a result, electric field concentration is likely to cause creeping discharge in the capacitor 1. A start point of the creeping discharge includes, for example, portions of points P1 to P3 encircled by circles in FIG. 3.

The point P1 indicates a contact portion (triple junction) of three elements of the insulation film 306, the upper electrode 305, and the buffer film 304. The triple junction causes significant electric field striction, and therefore electric field concentration readily occurs. Therefore, the point P1 is likely to become a start point of the creeping discharge.

The point P2 is a corner portion of the upper electrode 305, and is a contact portion of the upper electrode 305 and the insulation film 306. Furthermore, the point P3 is a corner portion of the upper electrode 305, and is a contact portion of the upper electrode 305 and the buffer film 304. Electric field striction becomes significant also at a corner portion of a conductor (the upper electrode 305 in the present embodiment) and a contact portion of the conductor and an insulator (the insulation film 306 in the present embodiment). Therefore, the points P2 and P3 are also likely to become start points of creeping discharge.

As schematically indicated by an arrow in FIG. 3, electric charges generated at, for example, the points P1 to P3 propagate in a direction traveling from the points P1 to P3 to the end portion of the substrate 301 propagating along the boundary between the insulation film 306 and the dielectric film 303 (or the buffer film 304) or the surface of the insulation film 306 (a path through which the generated electric charges propagate to the end portion of the substrate 301 will be referred to as an "electric charge path" below). The electric charges propagating along this boundary cause secondary electron avalanche, and gradually swell. Furthermore, when the swollen electric charges reach the end portion of the substrate 301, the increased electric charges are likely to cause element breakdown (e.g., breakdown).

In addition, the start point of the creeping discharge is likely to occur at any portion at which the electric field concentrates, and is not limited to the points P1 to P3.

The capacitor 1 according to the present embodiment includes the dummy trenches 200 between the capacitor formation region R and the end portion of the substrate 301, so that it is possible to extend the electric charge path from the start point of the creeping discharge to the end of the substrate 301. Consequently, it is possible to prevent the electric charges which have caused secondary electron avalanche from reaching the end portion of the substrate 301, and prevent element breakdown.

Furthermore, in the present embodiment, the dummy trenches 200 are formed in a region at shorter one of distances (a and b) from the capacitor formation region R to the end portion of the substrate 301 among regions between the capacitor formation region R and the end portion of the substrate 301. In a region at the shorter one of the distances (a and b) from the capacitor formation region R to the end portion of the substrate 301, a creeping discharge voltage is lower. Consequently, by forming the dummy trenches 200 in the region (the region on a side of the long side of the substrate 301 in the present embodiment) at the shorter one of the distances (a and b) from the capacitor formation region R to the end portion of the substrate 301, it is possible to more effectively improve a creeping discharge resistance.

Furthermore, in the present embodiment, the surface of the insulation film 306 includes the dents at positions meeting the cavities of the dummy trenches 200. Consequently, even when the electric charges pass the surface of the insulation film 306, it is possible to extend the electric charge path. Furthermore, when the dummy trenches 200 are formed, the dents are formed on the surface of the insulation film 306, so that it is not necessary to form the dents by cutting the surface of the insulation film 306 and it is possible to reduce a process.

In addition, the capacitor 1 may employ a configuration including a guard ring between the upper electrode 305 and the end portion of the substrate 301. The guard ring formed by using the insulation film can increase a distance between the upper electrode 305 and the substrate 301, so that it is possible to reduce the creeping discharge. Furthermore, the guard ring in an injection layer formed by adding an impurity near the end portion of the substrate 301 relaxes the electric field at the end portion of the substrate 301. Consequently, it is possible to reduce the electric field to be applied to the capacitor 1, and further reduce the creeping discharge.

Function of Ring Trench

Figure 4:
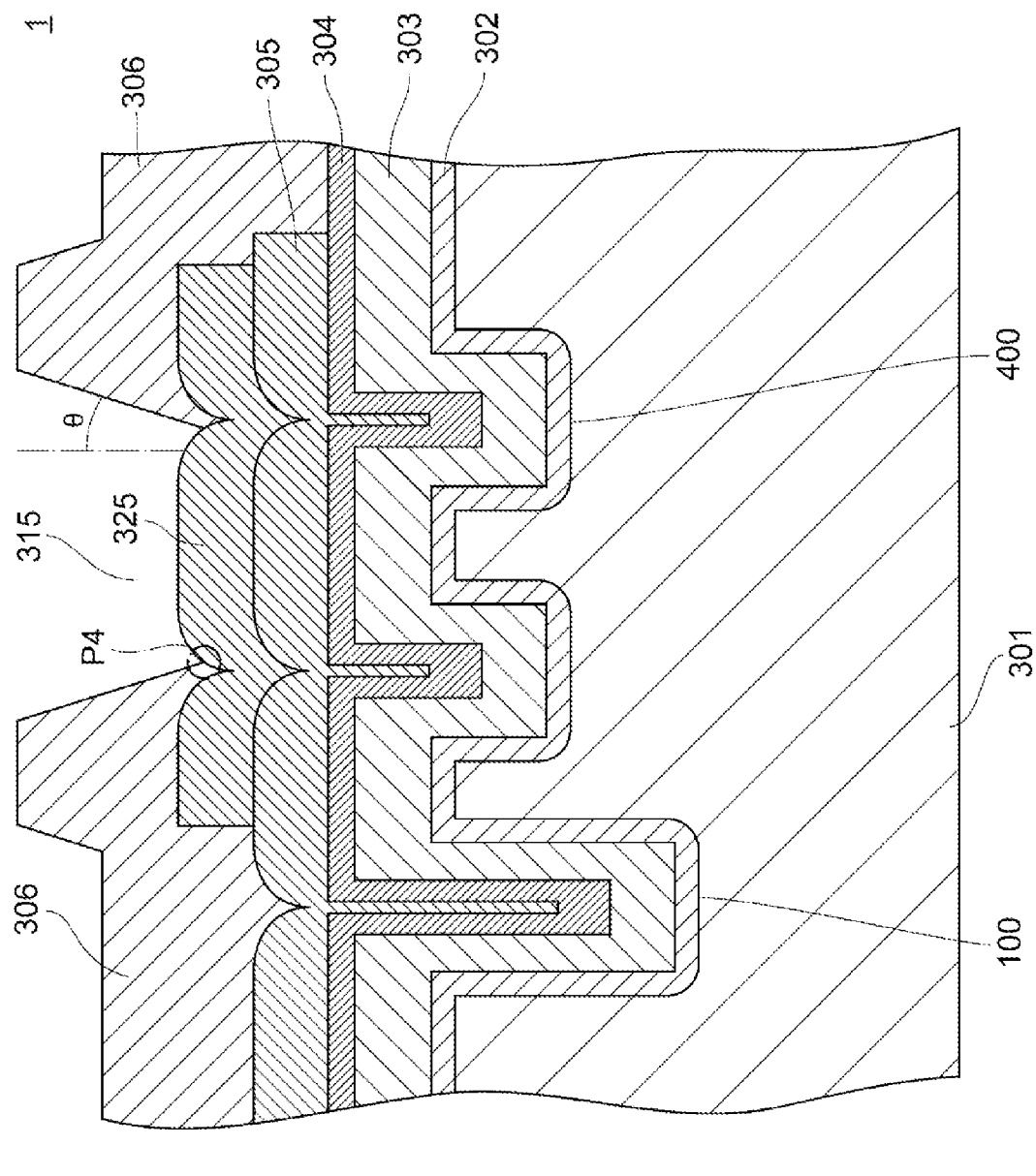
FIG. 4 is a BB' cross-sectional view of FIG. 1.

Next, a configuration and a function of a ring trench 400 will be described in detail with reference to FIG. 4. FIG. 4 is a view illustrating extracted part of a BB' cross section of FIG. 1.

As illustrated in FIG. 0.4, the ring trench 400 is formed adjacent to the region in which the trenches 100 are formed. The ring trench 400 is preferably shallower than the dummy trenches 200 and the trenches 100. In addition, the ring trench 400 can be formed by the same process such as etching as that of the trenches 100 and the dummy trenches 200. For example, the ring trench 400 is formed such that an opening diameter according to etching is smaller than an opening diameter for forming the trenches 100.

Similar to the trenches 100 and the dummy trenches 200, on an inner wall of the ring trench 400, the lower electrode 302, the dielectric film 303 and the buffer film 304 are formed, and the upper electrode 305 is stacked with the buffer film 304 interposed therebetween such that the opening of the ring trench 400 is filled. As a result, the surface of the upper electrode 305 includes the dent at the position meeting a cavity of the ring trench 400.

The terminal 325 is formed on the upper electrode 305 provided in a region in which the ring trench 400 is formed. Similar to the upper electrode 305, the terminal 325 is formed by using, for example, Mo (molybdenum), Al (aluminum), Au (gold), W (tungsten) and Pt (platinum). In addition, a material of the terminal 325 is not limited to a metal, as long as the material is a conductive material, and may be, for example, a conductive resin.

A surface of the terminal 325 formed on the ring trench 400 includes a dent at a position meeting the cavity of the ring trench 400. In addition, this dent is formed along a periphery of the terminal 325 in a plan view. Thus, the terminal 325 has a cross-sectional shape which bulges from the dent formed at the periphery portion to a center portion of the terminal 325.

Furthermore, the insulation film 306 formed to cover the upper electrode 305 and the terminal 325 includes a partially removed cavity (hole 315) in a substantially center region of the terminal 325. The hole 315 is formed at a substantially center of the terminal 325, and therefore the insulation film 306 is provided to cover part of the periphery portion (i.e., dent) of the terminal 325.

In FIG. 4, an end portion on a side of the hole 315 of the insulation film 306 is located near the deepest position in the dent of the terminal 325, and, more specifically, a position slightly closer to the center portion of the terminal 325 than the deepest position of the dent. The end portion on the side of the hole 315 of the insulation film 306 is preferably provided at the deepest position in the dent of the terminal 325, yet may be provided at a position close to the center side of the terminal 325 or the side of the end portion of the terminal 325. In addition, the deepest position of the dent of the terminal 325 refers to a point that is the farthest from a plane which widens along the center portion of the terminal 325 on the dent, i.e., the plane in the dent.

Furthermore, the end portion on the side of the hole 315 of the insulation film 306 is preferably formed such that an angle θ formed between the end portion and a vertical direction is equal to or more than 0 degree and less than 90 degrees.

An effect obtained by forming the insulation film 306 in the above shape on the terminal 325 will be described. In FIG. 4, a point P4 is a contact portion of the insulation film 306 and the terminal 325, and indicates a triple junction of three elements of the insulation film 306, the terminal 325 and a vacuum region (outside the capacitor 1). The insulation film 306 is formed to cover part of the dent of the terminal 325, so that it is possible to form differences in height at a center portion (top) of the terminal 325 and a connection portion of the terminal 325 and the insulation film 306. Thus, the insulation film 306 functions as a shield for the triple junction such as the point P4. That is, by forming the difference in height at the connection portion of the terminal 325 and the insulation film 306, the creeping discharge voltage at the triple junction increases, so that it is possible to prevent occurrence of the creeping discharge. Furthermore, as the angle θ becomes a more acute angle, a side surface on the side of the hole 315 of the insulation film 306 is closer to a bulged portion of the terminal 325. Consequently, it is possible to further increase the creeping discharge voltage, and prevent occurrence of the creeping discharge.

Second Embodiment

In the second exemplary embodiment and subsequent embodiments, matters common to those of the first embodiment described above will be omitted, and only differences will be described. Particularly, the same function and effect of the same configuration will not be successively mentioned for each embodiment.

Figure 5:
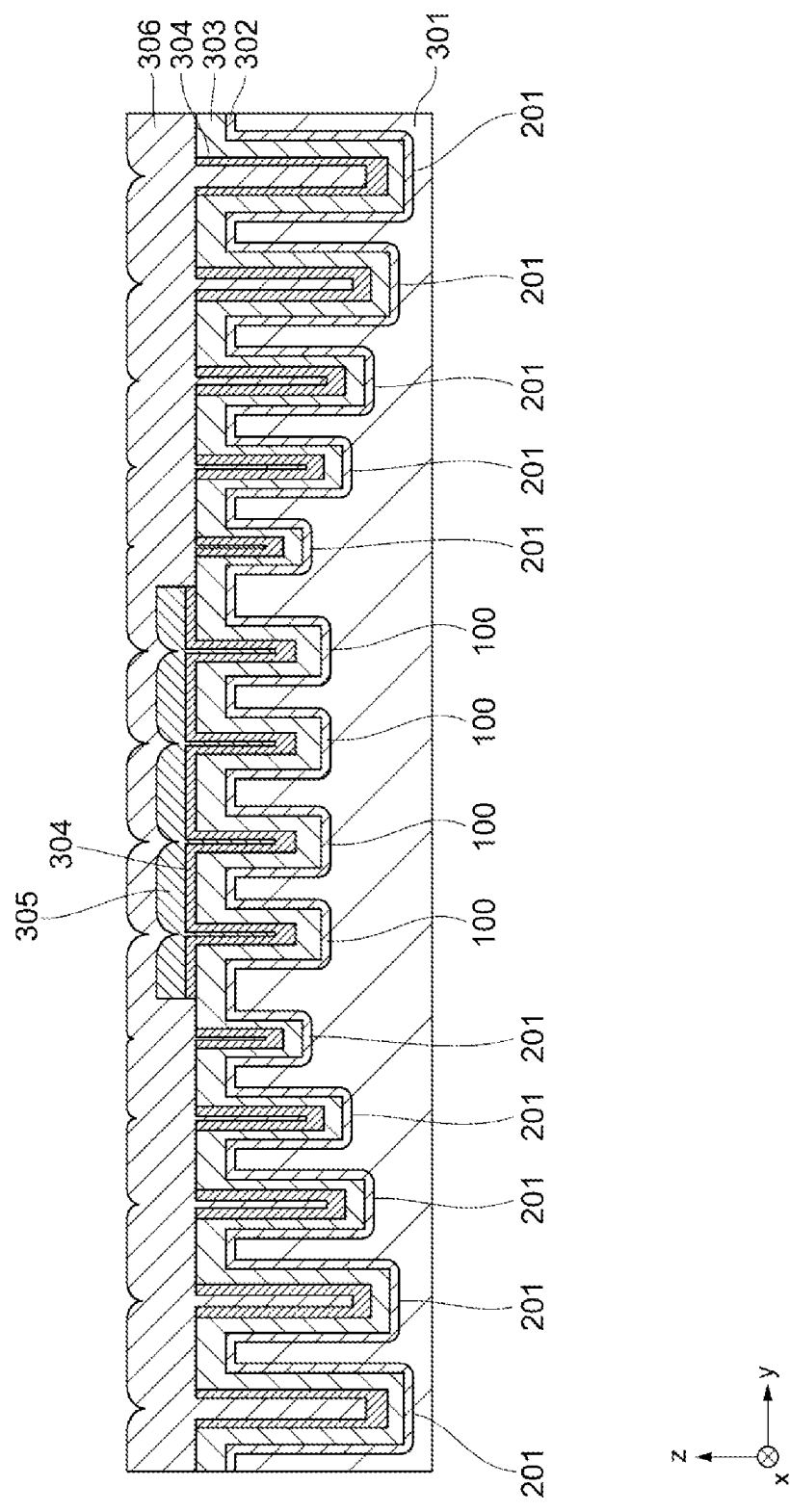
FIG. 5 is a cross-sectional view schematically illustrating a structure of the capacitor 1 according to a second exemplary embodiment.

FIG. 5 is a cross-sectional view illustrating a configuration example of the capacitor 1 according to the present embodiment. In addition, the same components as those of the capacitor 1 illustrated in FIG. 2 will be assigned with the same reference numerals, and explanation thereof will be omitted.

As illustrated in FIG. 5, the capacitor 1 according to the present embodiment includes dummy trenches 201 instead of the dummy trenches 200 according to the first embodiment.

In the present embodiment, preferably, the dummy trenches 201 formed near the end portion of the substrate 301 among a plurality of dummy trenches 201 have deeper grooves than the other dummy trenches 201, and the longer lengths along the first direction of the cavities. More preferably, toward the vicinity of the end portion of the substrate 301, the grooves of the dummy trenches to be formed become gradually deeper, and the lengths along the first direction of the cavities become gradually long.

When a plurality of capacitors 1 is formed on a wafer in a process of manufacturing the capacitors 1, and the substrate 301 is cut with a dicing machine to obtain the capacitors 1, a stress applies to the end portions (dicing lines) of the substrate 301. The capacitor 1 according to the present embodiment includes the dummy trenches 201 of the deep grooves near the end portion of the substrate 301, so that it is possible to reduce the stress to be applied to the substrate 301 during cutting with the dicing machine.

The other configuration and effect are the same as those of the first embodiment.

Third Embodiment

Figure 6:
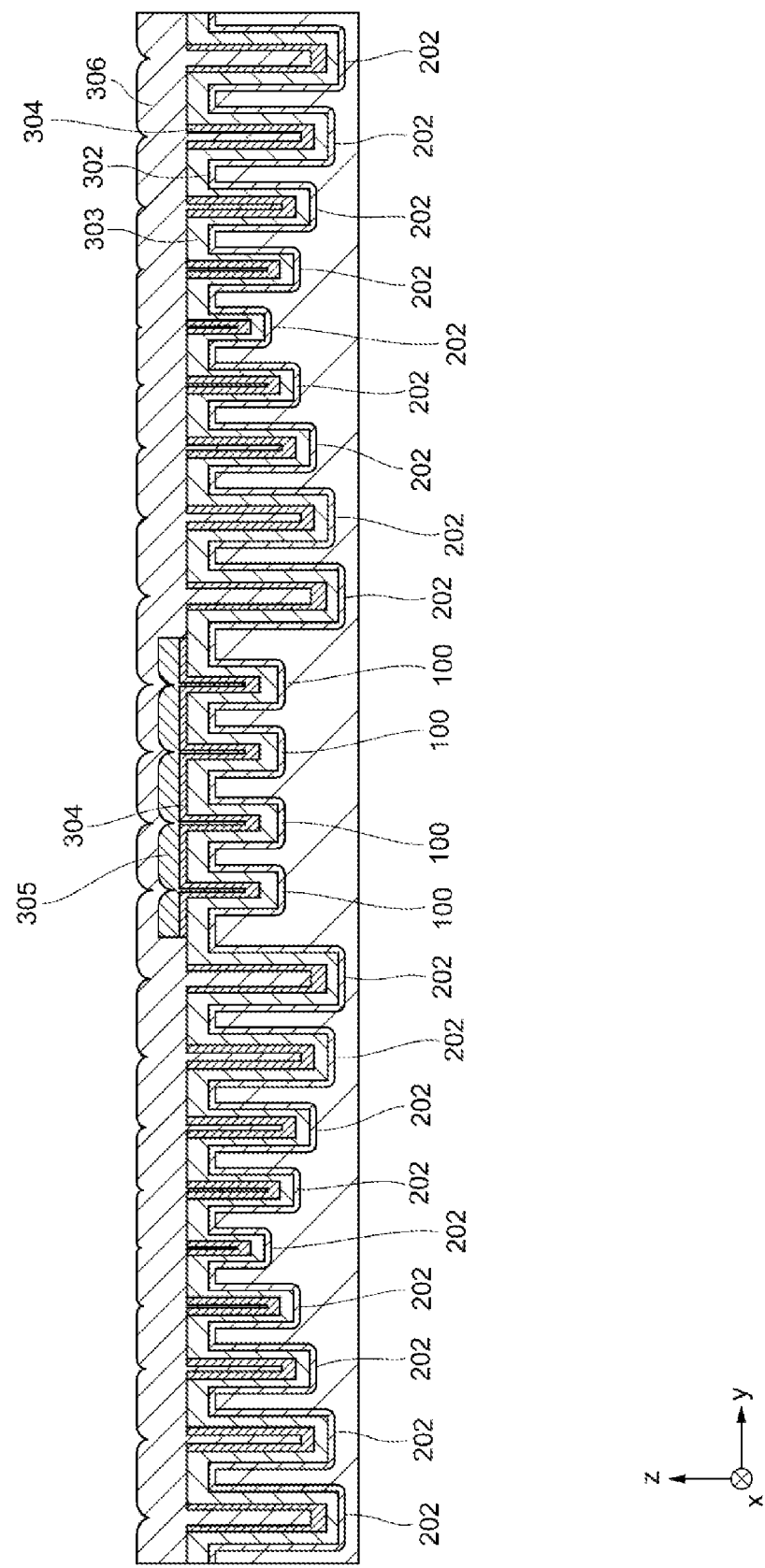
FIG. 6 is a cross-sectional view schematically illustrating a structure of the capacitor 1 according to a third exemplary embodiment.

FIG. 6 is a cross-sectional view illustrating a configuration example of the capacitor 1 according to the present embodiment. In addition, the same components as those of the capacitor 1 illustrated in FIG. 2 will be assigned with the same reference numerals, and explanation thereof will be omitted.

As illustrated in FIG. 6, the capacitor 1 according to the present embodiment includes dummy trenches 202 instead of the dummy trenches 200 according to the first embodiment.

In the present embodiment, preferably, the dummy trenches 202 formed near a boundary with a region R1 and the dummy trenches 202 formed near the end portion of the substrate 301 among a plurality of dummy trenches 202 have deeper grooves than the other dummy trenches 202, and the longer lengths along the first direction of the cavities. More preferably, the center dummy trenches 202 among a plurality of dummy trenches 202 aligned along the first direction have the shallowest grooves, and the short lengths along the first direction of the cavities. Hence, toward the vicinity of the end portion of the substrate 301 and the vicinity of the boundary of the region R1, the grooves of the dummy trenches 202 to be formed become gradually deeper, and the lengths along the first direction of the cavities become gradually longer.

The other configuration and effect are the same as those of the first embodiment and the second embodiment.

Fourth Embodiment

Figure 7:
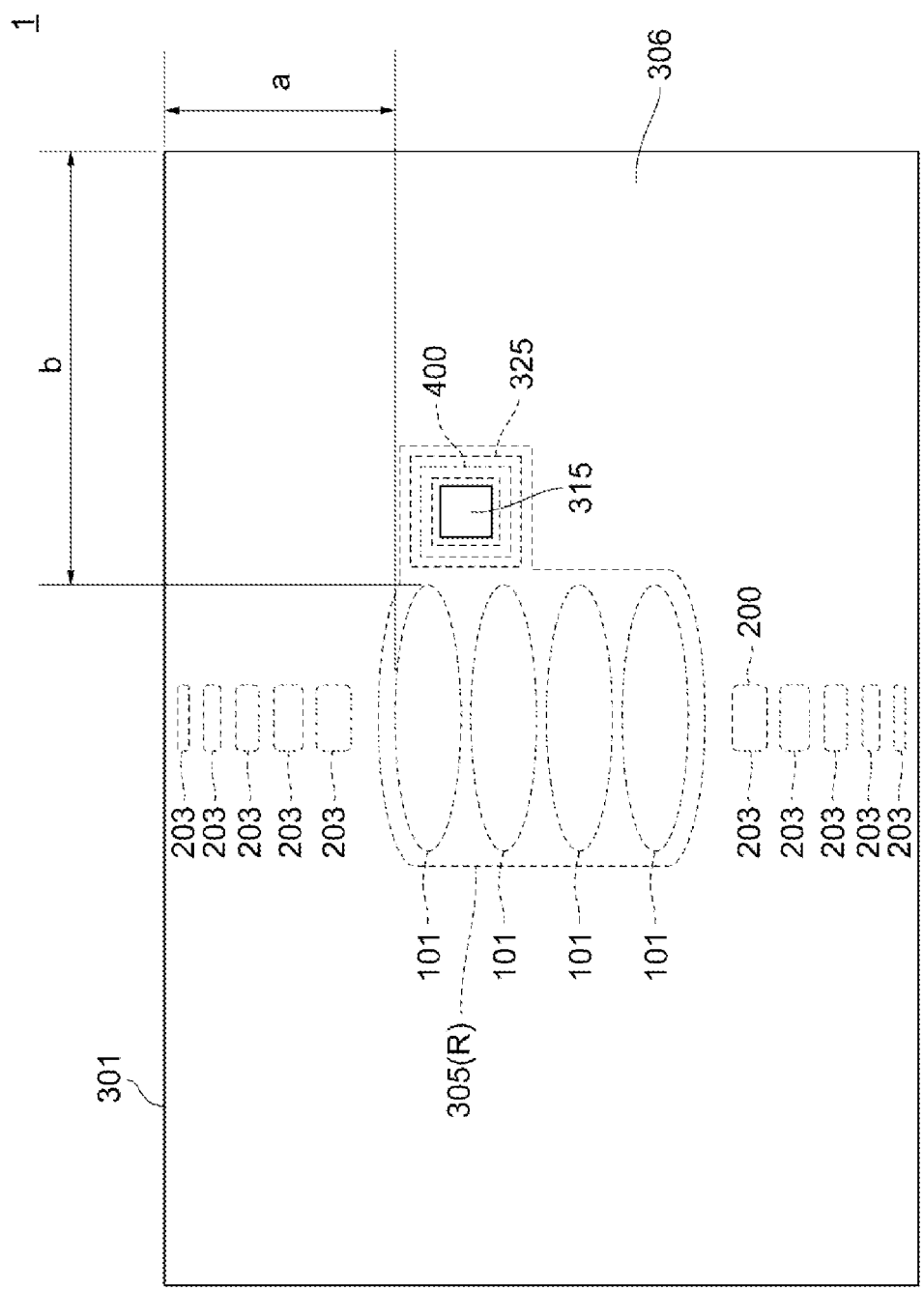
FIG. 7 is a plan view schematically illustrating a structure of the capacitor 1 according to a fourth exemplary embodiment.

FIG. 7 is a plan view illustrating a configuration example of the capacitor 1 according to the present embodiment. In addition, the same components as those of the capacitor 1 illustrated in FIGS. 1 and 2 will be assigned with the same reference numerals and explanation thereof will be omitted.

In the present embodiment, the capacitor 1 includes trenches 101 and dummy trenches 203 instead of the trenches 100 and the dummy trenches 200 according to the first embodiment.

As illustrated in FIG. 7, the trenches 101 have elliptical shapes having the longitudinal direction in a direction along the x axis. Furthermore, only one row of the trenches 101 is formed in the direction along the x axis direction. The other configuration of the trenches 101 is the same as the configuration of the trenches 100 according to the first embodiment.

Similar to the upper electrode 305 according to the first embodiment, the upper electrode 305 according to the present embodiment has a shape along outlines of the trenches 101 and the terminal 325. That is, the upper electrode 305 according to the present embodiment is designed such that a distance to the end portion of the substrate 301 is the shortest at a position of the outer rim of the upper electrode 305 corresponding to a contact point of a minor axis and a circumference of the trench 101 (i.e., the contact point of the outer rim of the upper electrode 305 and an extension line of the minor axis of the trench 101).

Next, the diameters in the longitudinal direction (the lengths along the x axis direction in FIG. 7) of cavities of the dummy trenches 203 according to the present embodiment are designed smaller than the major axes along the x axis direction of the trenches 101. Furthermore, the dummy trenches 203 are formed only in a region in which the distance between the end portion of the upper electrode 305 and the end portion of the substrate 301 is short. That is, the dummy trenches 203 are formed to cover at least a position of the upper electrode 305 corresponding to the contact point of the minor axis and the circumference of the trench 101.

Thus, according to the present embodiment, the lengths in the longitudinal direction of the dummy trenches 203 are formed shorter than the major axes of the trenches 101. Consequently, when, for example, there is not an extra space for layout on the substrate 301, the dummy trenches which can sufficiently reduce creeping discharge can be provided according to the layout. In other words, it is possible to improve the degree of layout freedom of elements and wires on the substrate 301.

In addition, in FIG. 7, a dummy trench is not formed in a region between the terminal 325 and the end portion of the substrate 301. However, there may be employed a configuration where the dummy trenches are also formed in the region.

The other configuration and effect are the same as those of the first embodiment.

Fifth Embodiment

Figure 8:
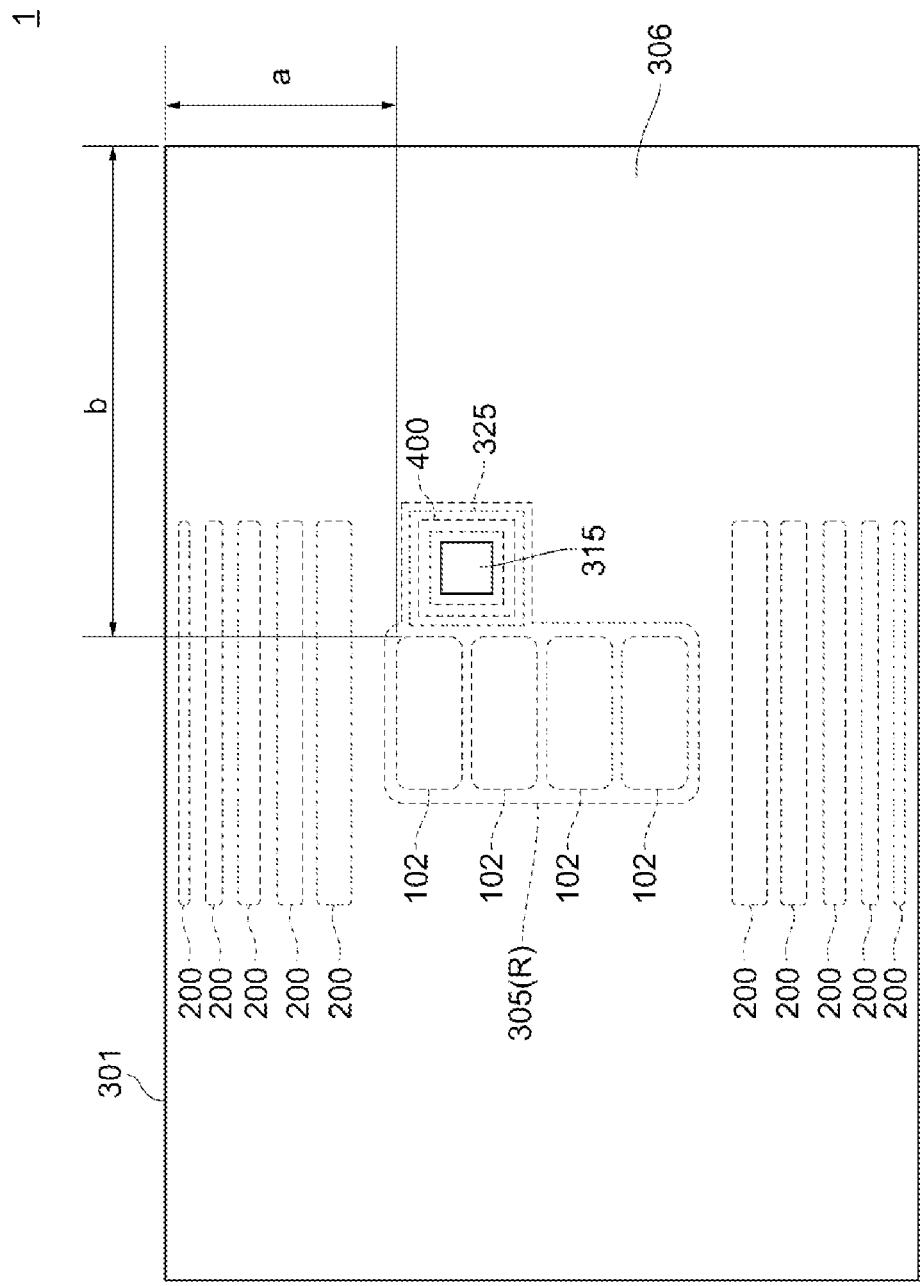
FIG. 8 is a plan view schematically illustrating a structure of the capacitor 1 according to a fifth exemplary embodiment.

FIG. 8 is a plan view illustrating a configuration example of the capacitor 1 according to the present embodiment. In addition, the same components as those of the capacitor 1 illustrated in FIGS. 1 and 2 will be assigned with the same reference numerals and explanation thereof will be omitted.

As illustrated in FIG. 8, the substrate 301 according to the present embodiment may include trenches 102 instead of the trenches 100.

Cavities of the trenches 102 have substantially rectangular shapes which have the longer diameters along the second direction than the diameters along the first direction. In addition, the shapes of the cavities of the trenches 102 are not limited to the substantially rectangular shapes, and may be, for example, elliptical shapes. Furthermore, the number of the trenches 102 to be aligned and provided in the first direction and/or the second direction is optional.

The other configuration and effect are the same as those of the first embodiment and the second embodiment.

The exemplary embodiments of the present invention have been described above. The capacitor 1 according to one embodiment of the present invention includes the substrate 301, the capacitor formation region R in which the one or more trenches 100 are provided on the substrate 301, a dummy region which is located between the capacitor formation region R and the end portion of the substrate 301 on the substrate 301 and in which the one or more dummy trenches 200 are formed, a first electrode (e.g., lower electrode 302) which is provided inside the one or more trenches 100 to cover at least the capacitor formation region R, the dielectric film 303, a second electrode (e.g., upper electrode 305) which is provided inside the one or more trenches 100 to cover the capacitor formation region R, and the insulation film 306 which is provided from the capacitor formation region R to the dummy region, and is provided to cover at least one of the one or more trenches 100 and at least one of the one or more dummy trenches 200. Consequently, the capacitor 1 according to one embodiment of the present invention can extend the electric charge path from a start point of creeping discharge to the end of the substrate 301. Consequently, the capacitor 1 can advantageously prevent electric charges which have caused secondary electron avalanche from reaching the end portion of the substrate 301, and prevent element breakdown.

Furthermore, the one or more dummy trenches 200 preferably include a plurality of dummy trenches 200, and are provided to be aligned in the first direction from the capacitor formation region R to the end portion of the substrate 301. Furthermore, preferably, the one or more dummy trenches 200 each include the cavity having the longitudinal direction, and the longitudinal direction is along the second direction substantially vertical to the first direction. Furthermore, preferably, the upper electrode 305 has the predetermined width in the longitudinal direction, and the diameters in the longitudinal direction of the cavities of the one or more dummy trenches 200 are larger than the predetermined width of the upper electrode 305. Consequently, it is possible to enhance creeping discharge characteristics of the capacitor 1.

Furthermore, the substrate 301 preferably has the rectangular shape including the first side and the second side vertical to the first side, the one or more dummy trenches 200 are provided between the capacitor formation region R and the first side, and the distance from the capacitor formation region R to the first side of the substrate 301 is shorter than the distance from the capacitor formation region R to the second side of the substrate 301. Thus, by providing the dummy trenches 200 only in the region in which the distance to the end portion of the substrate 301 is short, it is possible to enhance the creeping discharge characteristics even in a case where there is not the extra space for the layout of the capacitor 1.

Furthermore, the surface of the insulation film 306 preferably includes the dents at the positions meeting the cavities of the one or more dummy trenches 200. Consequently, even when the electric charges pass the surface of the insulation film 306, it is possible to extend the electric charge path.

Furthermore, preferably, the one or more dummy trenches 200 include the dummy trenches 200 provided near the boundary of the capacitor formation region R, and the dummy trenches 200 formed other than near the boundary, and the dummy trenches 200 provided near the boundary of the capacitor formation region R have the deeper grooves than the dummy trenches formed near other than the boundary. Furthermore, preferably, the one or more dummy trenches 200 include the dummy trenches 200 provided near the boundary of the capacitor formation region R, and the dummy trenches 200 formed other than near the boundary, and the dummy trenches 200 provided near the boundary of the capacitor formation region R have the longer lengths along the first direction of the cavities than the dummy trenches 200 provided other than near the boundary. By making the grooves of the dummy trenches 200 formed near the boundary of the capacitor formation region R deeper, the capacitor 1 according to the embodiment of the present invention can prevent concentration of the stress due to the upper electrode 305. Furthermore, by decreasing the lengths along the first direction of the cavities of the dummy trenches 200 formed other than near the boundary of the capacitor formation region R, it is possible to form more dummy trenches 200.

Furthermore, the one or more dummy trenches 200 preferably include the dummy trenches 200 provided near the end portion of the substrate 301, and the dummy trenches 200 formed other than near the end portion (i.e., closer to the center of the substrate), with the dummy trenches 200 provided near the end portion of the substrate 301 have the deeper grooves than the other dummy trenches 200. Furthermore, preferably, the one or more dummy trenches 200 include the dummy trenches 200 provided near the end portion of the substrate 301, and the dummy trenches 200 formed away from the end portion, and the dummy trenches 200 provided near the end portion of the substrate 301 have the longer lengths along the first direction of the cavities than the other dummy trenches 200 that are provided away from the end portion. The capacitor 1 according to the embodiment of the present invention includes the dummy trenches 201 with the deeper grooves near the end portion of the substrate 301, so that it is possible to reduce the stress to be applied to the substrate 301 during cutting with the dicing machine. Furthermore, by decreasing the lengths along the first direction of the cavities of the dummy trenches 200 formed other than near the boundary of the capacitor formation region R, it is possible to form more dummy trenches 200.

Furthermore, preferably, the capacitor 1 further includes the ring trench 400 which is provided in the region other than the region in which the one or more trenches 100 are provided in the capacitor formation region R, and includes the cavity of the ring shape, and the terminal 325 which is provided on the ring trench 400 with the upper electrode 305 interposed therebetween, and electrically connects the upper electrode 305 with the outside, and the surface of the terminal 325 includes the dent of the ring shape at the position meeting the cavity of the ring trench 400, and the insulation film 306 includes the hole formed in the dent of the ring shape. According to this preferred embodiment, the insulation film 306 is formed to cover part of the dent of the terminal 325, so that it is possible to form the differences in height at the center portion (top) of the terminal 325 and the connection portion of the terminal 325 and the insulation film 306. Consequently, the insulation film 306 functions as the shield of the triple junction. That is, by forming the difference in height at the connection portion of the terminal 325 and the insulation film 306, the creeping discharge voltage at the triple junction increases, so that it is possible to prevent occurrence of the creeping discharge. Furthermore, as the angle θ becomes a more acute angle, the side surface on the side of the hole 315 of the insulation film 306 is closer to a bulged portion of the terminal 325. Consequently, it is possible to further increase the creeping discharge voltage, and prevent occurrence of the creeping discharge.

In addition, it is noted that the above-described embodiments facilitate understanding of the present invention and are not intended to limit the present invention. The present invention can be modified/improved without departing from the gist of the invention, and include equivalents thereof. That is, design changes appropriately added to each embodiment by those skilled in the art are also incorporated in the scope of the present invention as long as the design changes include the features of the present invention. For example, the components of each embodiment, the arrangement, materials, conditions, shapes, and sizes of the components are not limited to those exemplified above and can be appropriately changed.

Figure 9:
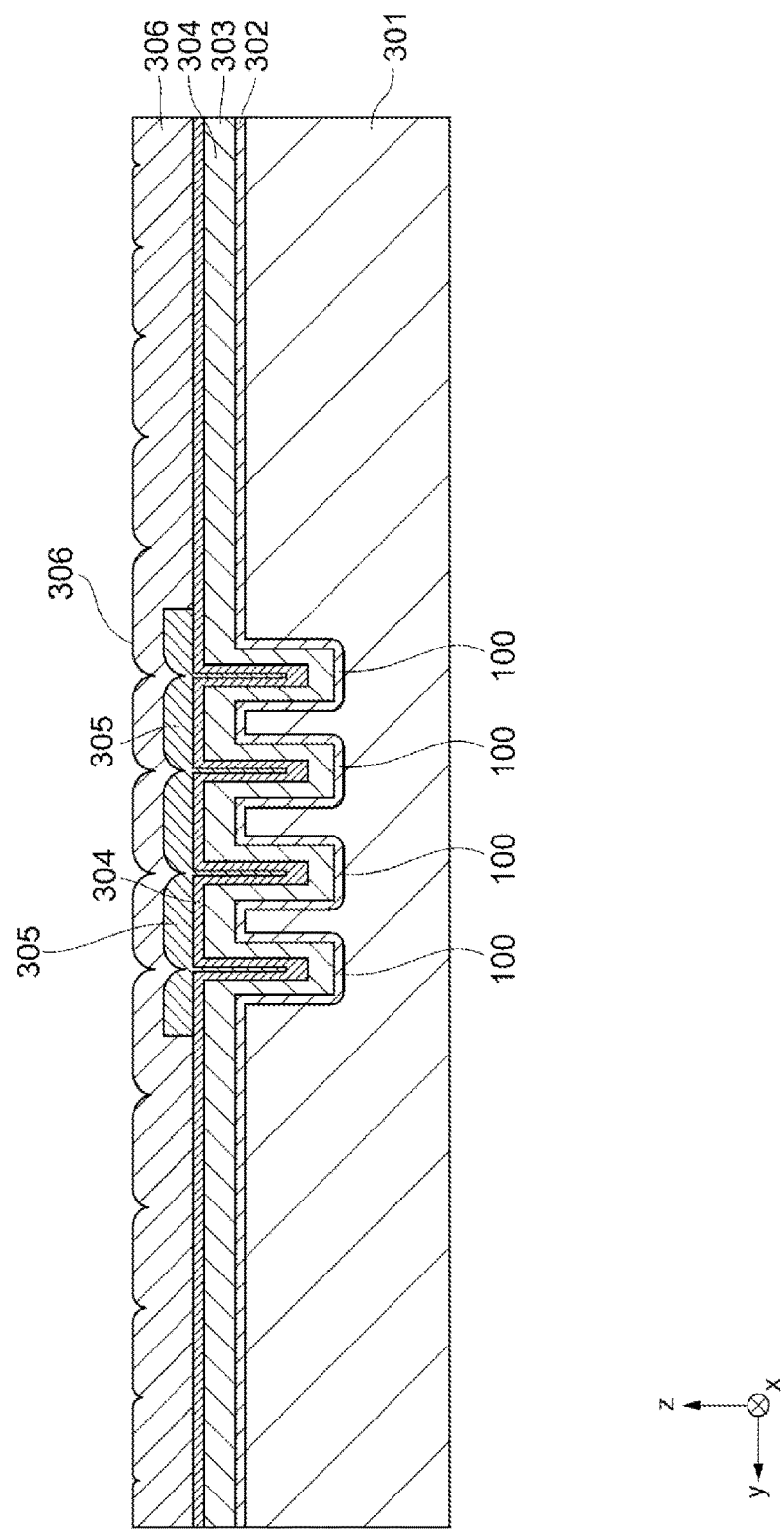
FIG. 9 is a cross-sectional view schematically illustrating a structure of the capacitor 1 according to another exemplary embodiment.

The above-described embodiments have described, for example, the configuration where the capacitor 1 includes the ring trench 400, yet are not limited to these. For example, the capacitor 1 may employ a configuration which does not include the ring trench 400. Furthermore, the capacitor 1 may employ a configuration which includes the dummy trenches 200 only at positions meeting one of the trenches 100 and the ring trench 400. Furthermore, the capacitor 1 may employ a configuration where, instead of the dummy trenches 200, the insulation film 306 is formed to be recessed on the substrate 301 (FIG. 9). In this case, the insulation film 306 functions as an extended portion. Furthermore, as illustrated in FIG. 9, by forming recesses and protrusions on the surface of the insulation film 306, it is possible to further extend the path length from the end portion of the upper electrode 305 to the end portion of the substrate 301.

Naturally, each embodiment is an exemplary embodiment, and configurations described in the different embodiments can be partially replaced or combined and are also included in the scope of the present invention as long as the configurations include the features of the present invention.

DESCRIPTION OF REFERENCE SYMBOLS

1: CAPACITOR
100, 101: TRENCH
200, 201, 202, 203: DUMMY TRENCH
301: SUBSTRATE
302: LOWER ELECTRODE
303: DIELECTRIC FILM
304: BUFFER FILM
305: UPPER ELECTRODE
325: TERMINAL
306: INSULATION FILM

The invention claimed is:
1. A capacitor comprising:
a substrate;
a capacitor formation region having at least one trench extending in the substrate;
a dummy region disposed between the capacitor formation region and an end of the substrate;
a first electrode disposed inside the at least one trench and that covers at least the capacitor formation region;
a dielectric film that covers the first electrode; and a second electrode that covers the capacitor formation region and has a different potential from the first electrode, wherein the dummy region comprises an extended portion that forms one of a recess or a protrusion on the substrate in a path from the second electrode to the end of the substrate, wherein the extended portion comprises at least one dummy trench configured for reducing a creeping discharge voltage between the first and second electrode and extending in a thickness direction of the substrate, with the at least one dummy trench including at least one cavity, respectively, having a longitudinal direction that extends in a second direction vertical relative to a first direction extending from the capacitor formation region to the end of the substrate.

2. The capacitor according to claim 1, wherein the extended portion is provided on a shortest path between the second electrode and the end of the substrate.

3. The capacitor according to claim 1, wherein the extended portion includes an insulation film that covers the substrate.

4. The capacitor according to claim 1,
wherein the second electrode has a width in the longitudinal direction, and
wherein a diameter in the longitudinal direction of the at least one cavity is wider than the width of the second electrode.

5. The capacitor according to claim 1,
wherein the substrate comprises a rectangular shape with a first side and a second side vertical to the first side,
wherein the at least one dummy trench is disposed between the capacitor formation region and the first side of the substrate, and
wherein a distance from the capacitor formation region to the first side of the substrate is shorter than a distance from the capacitor formation region to the second side of the substrate.

6. The capacitor according to claim 1, further comprising an insulation film that extends from the capacitor formation region to the dummy region and that covers the at least one trench and the at least one dummy trench.

7. The capacitor according to claim 6, wherein the insulation film has a dent at a position meeting the cavity of the at least one dummy trench.

8. The capacitor according to claim 1, wherein the at least one dummy trench includes a pair of dummy trenches with a first dummy trench disposed closer to the capacitor formation region than a second dummy trench and having a deeper groove than the second dummy trench.

9. The capacitor according to claim 1, wherein the at least one dummy trench includes a pair of dummy trenches with a first dummy trench disposed closer to the capacitor formation region than a second dummy trench and having a longer length along the thickness direction of the substrate than the second dummy trench.

10. The capacitor according to claim 1, wherein the at least one dummy trench comprises a pair of dummy trenches with a first dummy trench disposed closer to the end of the substrate than a second dummy trench and having a deeper groove than the second dummy trench.

11. The capacitor according to claim 1, wherein the at least one dummy trench include a pair of dummy trenches with a first dummy trench disposed closer to the end of the substrate than a second dummy and having a longer length along the thickness direction of the substrate than the second dummy trench.

12. The capacitor according to claim 6, further comprising:
a ring trench disposed in a region other than a region where the at least one trench is disposed in the capacitor formation region, and includes a cavity of a ring shape; and
a terminal disposed on the ring trench with the second electrode interposed therebetween and electrically connected to the second electrode.

13. The capacitor according to claim 12, wherein the terminal comprises a surface that includes a dent of a ring shape at a position meeting the cavity of the ring trench, and the insulation film includes a hole disposed in the dent of the ring shape.

14. A capacitor comprising:
a substrate having a top surface;
a capacitor formation region disposed in a center region of the substrate and including at least one trench extending into the substrate;
a plurality of dummy trenches disposed on opposing sides of the capacitor formation region, with each of the plurality of dummy trenches extending into the substrate;
a first electrode disposed inside the at least one trench of the capacitor formation region;
a dielectric film disposed on the first electrode; and
a second electrode disposed on the dielectric film and that has a different potential from the first electrode,
wherein at least the second electrode is electrically insulated from the plurality of dummy trenches, and
wherein the plurality of dummy trenches are disposed to reduce a creeping discharge voltage between the first and second electrode.

15. The capacitor according to claim 14, wherein the plurality of dummy trenches each comprise a respective cavity having a longitudinal direction that is perpendicular between the capacitor formation region and a respective end of the substrate.

16. The capacitor according to claim 15,
wherein the second electrode has a width in the longitudinal direction, and
wherein a diameter in the longitudinal direction of each respective cavity is wider than the width of the second electrode.

17. The capacitor according to claim 14,
wherein the substrate comprises a rectangular shape with a first side and a second side perpendicular to the first side, and
wherein a distance from the capacitor formation region to the first side of the substrate is shorter than a distance from the capacitor formation region to the second side of the substrate.

18. The capacitor according to claim 15, further comprising an insulation film that extends from the capacitor formation region to the plurality of dummy trenches and includes a plurality of dents at respective positions that meeting the respective cavities of the plurality of dummy trenches.

* * * * *